United States Patent
Horsky et al.

(10) Patent No.: US 8,446,209 B1
(45) Date of Patent: May 21, 2013

(54) SEMICONDUCTOR DEVICE AND METHOD OF FORMING SAME FOR TEMPERATURE COMPENSATING ACTIVE RESISTANCE

(75) Inventors: Pavel Horsky, Brno (CZ); Michal Olsak, Sokolnice (CZ)

(73) Assignee: Semiconductor Components Industries, LLC, Phoenix, AZ (US)

( * ) Notice: Subject to any disclaimer, the term of this patent is extended or adjusted under 35 U.S.C. 154(b) by 77 days.

(21) Appl. No.: 13/305,530

(22) Filed: Nov. 28, 2011

(51) Int. Cl.
*H01L 35/00* (2006.01)
(52) U.S. Cl.
USPC ......................................................... 327/513
(58) Field of Classification Search
USPC ................ 327/512, 513, 534, 538, 543
See application file for complete search history.

(56) References Cited

U.S. PATENT DOCUMENTS

| | | | |
|---|---|---|---|
| 5,703,575 A * | 12/1997 | Kirkpatrick | 340/870.17 |
| 6,717,457 B2 * | 4/2004 | Nanba et al. | 327/513 |
| 7,658,539 B2 * | 2/2010 | Engelstad | 374/163 |
| 8,159,448 B2 * | 4/2012 | Barrow | 345/101 |
| 8,390,363 B2 * | 3/2013 | Engl | 327/512 |
| 2009/0002056 A1 | 1/2009 | Doyle et al. | |
| 2010/0176886 A1 | 7/2010 | Feng et al. | |

* cited by examiner

*Primary Examiner* — Jeffrey Zweizig
(74) *Attorney, Agent, or Firm* — Scott M. Garret; Patents on Demand, P.A.; Brian K. Buchheit

(57) ABSTRACT

In an embodiment a circuit provides an active resistance that is adjusted with temperature, the active resistance has a magnitude and temperature coefficient that is selected by the values of external resistors. The active resistance is controlled by an active resistance controller that uses a temperature dependent source and a temperature stable source to control adjustment of a first adjustable resistance to maintain correspondence between a temperature dependent parameter and a temperature stable parameter, and adjusts a second adjustable resistance that is part of the active resistance in correspondence with adjustment of the first adjustable resistance.

20 Claims, 5 Drawing Sheets

SEMICONDUCTOR DEVICE AND METHOD OF FORMING SAME FOR TEMPERATURE COMPENSATING ACTIVE RESISTANCE

BACKGROUND

The invention relates generally to methods, semiconductor devices, electrical and electronic circuits, and products useful in providing temperature compensation in such methods, semiconductor devices, electrical and electronic circuits.

The problem of temperature effects in semiconductor and other electronic circuits, which causes the electrical properties to change with temperature, has existed since such circuits were first developed. The temperature of the material used in electronic and semiconductor devices, circuits, and components affects the electrical properties at a physical level, and accordingly, operating parameters change. While in some applications the temperature related changes in operating parameters of electronic and semiconductor elements are sufficiently small that, given the purpose of the circuit or system using the elements, compensation is not necessary to maintain operation of the circuit or system within desired performance bounds. However, in many types of applications, such as in sensors, instrumentation, and communications, among many examples, temperature effects, if not compensated, can cause circuits and systems to be essentially unusable in an environment where the temperature changes. Given that temperature change can occur not just due to the ambient temperature, but also because of self-heating effects of power dissipation in electric and electronic devices, temperature compensation is necessary in many applications.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE DRAWINGS

While the specification concludes with claims defining features of embodiments that are regarded as novel, it is believed that such embodiments will be better understood from a consideration of the description in conjunction with the drawings. As required, detailed embodiments are disclosed herein; however, it is to be understood that the disclosed embodiments are, in general, exemplary. Some embodiments may be implemented in alternative forms. For example, the invention can be embodied as a semiconductor device or product, a circuit, or a method, including a method of forming a semiconductor device or circuit, among other embodiments. The various embodiments of semiconductor products and devices, and methods of forming and/or configuring them, as disclosed herein, can be fabricated using conventional techniques along with the novel processes and structures taught herein, and can include integrated or discrete circuit arrangements, or both. Therefore, specific structural and functional details disclosed herein are not to be necessarily interpreted as limiting, but as a basis for the claims and as a representative basis for teaching one skilled in the art to variously employ the invention in any appropriately detailed structure. Further, the terms and phrases used herein are not intended to be limiting but rather to provide an understandable description of the invention. However, where a definition is provided for a term or phrase, the provided definition should be used in interpreting the claims invoking the term or phrase.

A circuit which operates under varying temperature conditions can suffer from temperature variations due to changes in the electronic and electrical properties of components in the circuit as those components change temperature. Generally, the temperature related change of a given circuit parameter can be characterized with a temperature coefficient. A temperature coefficient is a factor that defines temperature dependency of a circuit parameter. To counteract the tendency to change with temperature, an element can be introduced into the circuit which has a matching, but opposite temperature coefficient. An active resistance element provides a simple means for introducing a resistance into a circuit to counteract the effects of temperature drift. It is desirable to be able to select both the coefficient as well as the magnitude of the active resistance element provided to the circuit.

Figure 1:
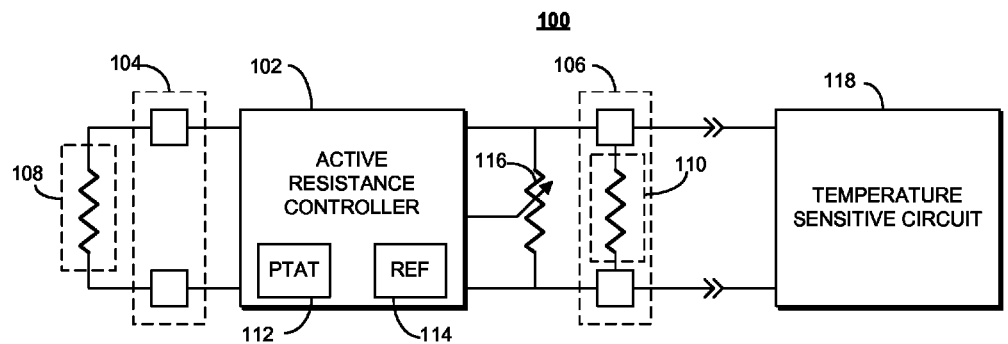
FIG. 1 shows a block diagram circuit schematic for a circuit providing a temperature compensating active resistance, in accordance with an embodiment.

Referring to FIG. 1, there is shown a block diagram circuit schematic 100 for a circuit producing a temperature compensating active resistance, in accordance with an embodiment. The circuit can be a semiconductor circuit formed, for example, in a semiconductor product or device, and generally allows setting a magnitude and a temperature coefficient of the active resistance by selecting the resistance values of both the first external resistor 108 and the second external resistor 110. Each of the first and second resistances can be ordinary lumped resistance components, which are commonly referred to simply as resistors. The resistors generally have a negligible temperature coefficient and hold their resistance value within a small range over temperature. Generally the circuit can be in, or part of, an integrated circuit, and the first and second resistors can be provided as external elements so that the circuit can be employed in a variety of applications, allowing the temperature coefficient and magnitude to be externally selected by the values of the first and second resistors.

The circuit includes an active resistance controller 102 that controls the value of an active resistance presented to a temperature sensitive circuit 118, and includes an adjustable resistance 116, a resistor interface 106 to couple to another resistance which together with the adjustable resistance 116 forms the active resistance. The active resistance controller 102 adjusts the adjustable resistance 116 in a manner that tends to counteract a temperature effect in a temperature sensitive circuit 118. The active resistance controller 102 can further include, or be further coupled to, a temperature dependent electrical source, such as, for example, a proportional to absolute temperature (PTAT) source 112. The PTAT source 112 provides a temperature-dependent electrical parameter. The active resistance controller 102 further includes a temperature-stable electrical source 114 that remains substantially constant over temperature. Both the temperature dependent source 112 and the temperature stable source 114 can be provided by, for example, a bandgap circuit, as is known. The circuit 100 has a first resistor interface 104 and a second resistor interface 106, which provide a means to electrically connect to first control resistor 108 and second control resistor 110, respectively. Both the first and second control resistors 108, 110 can be external resistors that are electrically connected to their respective resistor interfaces 104, 106, but which are packaged separately from any packaging used to package the active resistance controller 102. Thus, the first and second resistor interfaces are configured to be coupled to external resistors in at least one embodiment. The values of the external resistors determine the resulting magnitude and temperature coefficient of the active resistance presented to the temperature sensitive circuit 118. In another embodiment the first and second resistor interfaces can be coupled to configurable resistances that can be set prior to operation of the circuit to select operating parameters of the active resistance.

The first and second resistor interfaces 104, 106 can be, for example, pins or other conductors disposed on an integrated circuit package and adapted to be soldered or otherwise electrically connected to, for example, a circuit board, which can provide separate connection points or pads for each of the resistors 108, 110. Two pins, one for each interface 104, 106 can be provided and the resistors can be coupled to a common ground. The active resistance is the resistance seen by the temperature sensitive circuit 118 looking out to the second resistor interface 106, and results from a combination of the second external resistance 110 and an adjustable resistance 116, which is adjusted in response to temperature. The resistance values of both the first external resistor 108 and the second external resistor 110 are used to define or set, generally, the magnitude and the temperature coefficient of the active resistance. Although shown here in parallel, the second external resistance 110 could alternatively be placed in series with the adjustable resistance 116 to produce the active resistance. The active resistance resulting from the combination of second external resistor 110 and the adjustable resistance 116 can be presented to a temperature sensitive circuit 118, and used to compensate or offset the effects of temperature on operating parameters of the temperature sensitive circuit 118.

The active resistance controller 102 uses the PTAT source 112 to provide a temperature dependent electrical parameter to the first external resistor 108 via the first resistor interface 104. The temperature dependent electrical parameter can be a voltage or current that varies proportionally with temperature. The proportional variation can be directly or inversely proportional, which can also be referred to as "complementary". The temperature dependent parameter is monitored or sampled by the active resistance controller 102 to adjust the adjustable resistance 116 by an internal feedback circuit. As the temperature dependent parameter is monitored or sampled, it can be compared to the temperature stable reference 114 to drive or determine a corresponding change of the adjustable resistance 116. The active resistance controller 102 adjusts the adjustable resistance 116 in proportion to changes in the PTAT as applied to the first external resistance 108, which can be measured against the reference 114. In at least one embodiment the active resistance controller 102, first and second resistor interfaces 104, 106, adjustable resistance 116, and temperature sensitive circuit 118 can be packaged together as a semiconductor product in an integrated circuit.

Figure 2:
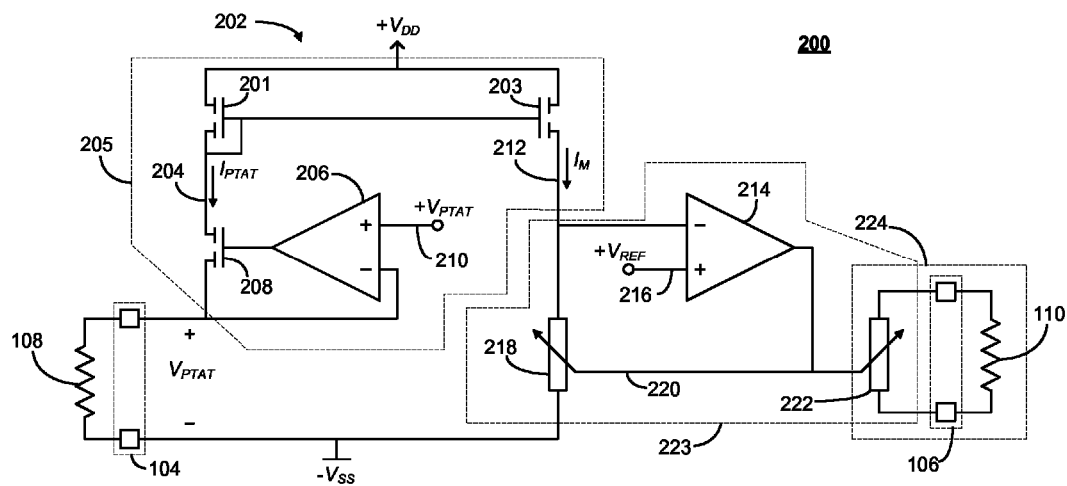
FIG. 2 shows a circuit schematic diagram for providing a temperature compensating active resistance, in accordance with an embodiment.

FIG. 2 shows a circuit schematic diagram 200 for providing a temperature compensating active resistance, in accordance with an embodiment. The present embodiment includes one possible implementation of an embodiment of an active resistance controller 202. The active resistance controller 202 can include a mirroring block 205 and a resistance adjuster circuit 223. The mirroring block 205 can include a current mirror composed of a first transistor 201 and a second transistor 203, the first transistor 201 senses current in a first leg 204 of the current mirror. An op amp 206 can be used to control current through a regulator device 208 that can be, for example, a transistor. The op amp 206 receives a temperature dependent voltage, such as a PTAT voltage, at a non-inverting input 210. The PTAT voltage is provided by, for example, a bandgap source. The op amp 206 controls the regulator device 208 such that a PTAT voltage is applied to the first external resistor 108, which is coupled to the circuit via the first resistor interface 104. As a result, a PTAT current, $I_{PTAT}$, flows through the first leg 204 and through the first external resistor 108. As the voltage provided by the PTAT source at input 210, and across the first external resistor 108, varies with temperature, the op amp adjusts the regulator device 208 so that the PTAT current maintains the voltage across the first external resistor 108 as the voltage at input 210 changes.

The current mirror of transistors 201, 203 produces a mirror current, $I_M$, through a second leg 212 of the mirroring block 205. The mirror current is proportional to the PTAT current in the first leg of the current mirror. The mirror current is provided to a first adjustable resistance 218, and creates a voltage across the first adjustable resistance 218 which is sampled in the resistance adjuster circuit 223 at a comparator 214, that can be an op-amp or similar component. The comparator 214 compares the voltage across the first adjustable resistance 218 to a temperature stable voltage reference 216, $V_{REF}$. The comparator 214 provides an output 220 that adjusts or changes the resistance of the first adjustable resistance 218 such that the voltage across the first adjustable resistance 218 remains substantially equal or at a selected proportion to the temperature stable voltage reference 216.

The output 220 of the comparator 214 is further coupled to a second adjustable resistance 222, which can be substantially the same as adjustable resistance 116 of FIG. 1. The output 220 of the comparator 214 causes the second adjustable resistance 222 to be adjusted or changed proportionally, directly or inversely, with the first adjustable resistance 218, and hence, the PTAT voltage 210. The second adjustable resistance 222 is, in the present embodiment, coupled in parallel with the second resistor interface 106 and second external resistor 110. The second adjustable resistance 222 and second external resistor 110 combine to produce an effective active resistance 224 that can be provided as a circuit element to a temperature sensitive or temperature dependent circuit to compensate the temperature dependent circuit over variations of its operating temperature.

The temperature coefficient of the resulting active resistance 224 is set by the ratio of the second external resistor 110 and the first external resistor 108. For a constant ratio of the second external resistor 110 and the first external resistor 108 the temperature coefficient of the resulting active resistance 224 stays constant. The nominal magnitude of the resulting active resistance 224 for a nominal temperature can be set by selecting the resistance of the second external resistor 110 and the first external resistor 108, keeping constant ratio of the second external resistor 110 and the first external resistor 108.

Figure 3:
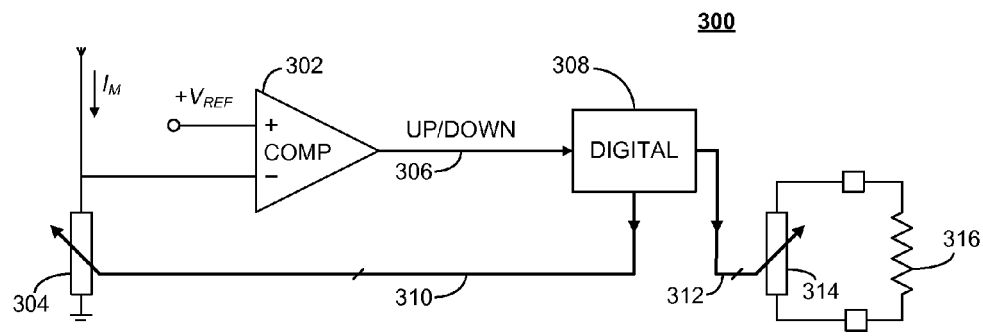
FIG. 3 shows a digital implementation of a resistance adjuster circuit for controlling an active resistance, in accordance with an embodiment.

FIG. 3 shows a digital implementation of a resistance adjuster circuit 300 with interfacing resistors for controlling an active resistance, in accordance with an embodiment. The resistance adjuster circuit can be substantially similar to the resistance adjuster circuit 223 of FIG. 2. A comparator circuit 302 compares the voltage across a first adjustable resistance 304 resulting from the mirror current, $I_M$, with a temperature stable reference voltage, $V_{REF}$. The output 306 of the comparator circuit remains high when the voltage across the first adjustable resistance 304 is below $V_{REF}$. Likewise, the output 306 goes to a low state when the voltage across the first adjustable resistance 304 is above $V_{REF}$. A digital averager 308 can clock or accumulate the output 306 of the comparator circuit 302 to a digital level that is proportional to the mirror current $I_M$. The digital value can be put out on busses 310, 312 to the first and second adjustable resistance 304, 314, respectively. The digital value on the busses 310, 312, can control the value of the first and second adjustable resistances, respectively. Alternatively, a single bus can be used and connected to both the first and second adjustable resistances 304, 314.

Figure 4:
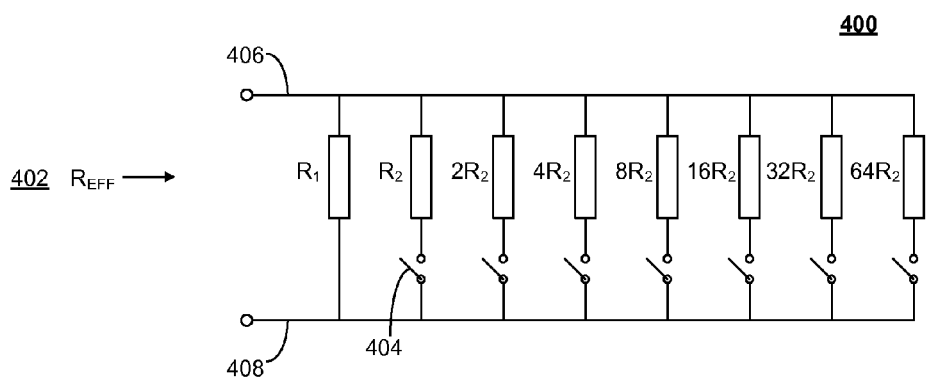
FIG. 4 shows an implementation of a digitally adjustable resistance, in accordance with an embodiment.

FIG. 4 shows an example of a digitally adjustable resistance 400, in accordance with an embodiment. The digitally adjustable resistance 400 provides an effective resistance 402, $R_{EFF}$, looking into the terminals 406, 408. A series of resistances $R_1$, $R_2$, $2R_2$, $4R_2$, $8R_2$, $16R_2$, $32R_2$, and $64R_2$ are each selectively coupled between the terminals by a corresponding switch, such as switch 404. Each switch is tied to one line of a bus such as busses 310, 312 of FIG. 3. Each of the resistances is digitally proportioned; $2R_2$ has twice the resistance (or half the conductance) of $R_2$, $4R_2$ has 4 times the value of $R_2$, and so on. The exemplary structure of FIG. 4 therefore provides 128 steps of resolution for the effective resistance 402 presented at the terminals 406, 408. As the digital value output on the bus increases, the effective conductance $1/R_{EFF}$ 402 increases linearly.

Figure 5:
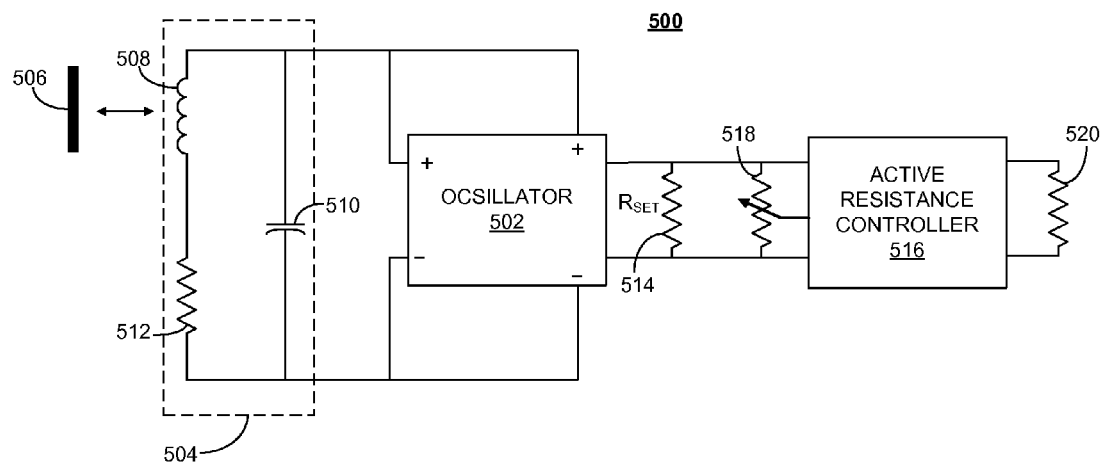
FIG. 5 shows a distance sensing application using a temperature compensating active resistance, in accordance with an embodiment.

FIG. 5 shows an implementation of one application using an embodiment of the invention for temperature compensation. In particular, the application is a distance sensing circuit 500 using a temperature compensating active resistance, in accordance with an embodiment. The distance sensing circuit uses an oscillator 502 to drive a parallel LC resonant circuit 504 and measure an equivalent conductance $G_{LC}$ of the parallel resonant circuit at its resonant frequency. The parallel resonant circuit includes capacitance 510 and an inductance 508 with losses represented by an equivalent resistance 512. The inductance can be a coil that is oriented so as to produce a magnetic field in a particular direction. Thus, the inductance 508 can be used to sense proximity of metallic objects, such as metallic object 506, in the magnetic field produced by the coil. As a metallic object 506, which is magnetically reactive, is moved relative to the inductance 508 in the magnetic field produced by the inductance 508, the conductance $G_{LC}$ of the parallel resonant circuit at resonant frequency changes. Generally the conductance increases as the metallic object moves closer to the inductance 508. A given distance threshold can be detected when the conductance of the resonant circuit becomes equal to the conductance of the oscillator, $G_{LC}=G_{OSC}$, as the object 506 is moved towards the inductance 508. This effect is useful in many applications, including, for example, eddy-current proximity switches.

Figure 6:
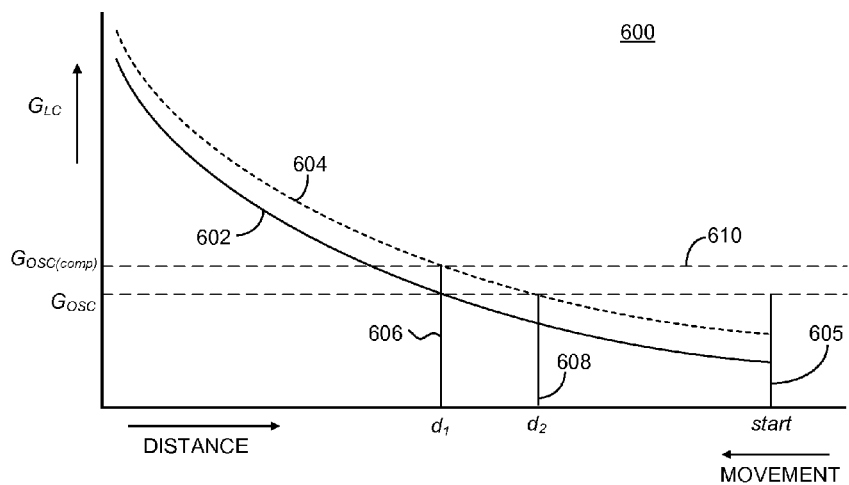
FIG. 6 shows a graph chart of the dependency of the conductance $G_{LC}$ of the parallel resonance circuit on coil-metal distance and temperature.

The conductance $G_{LC}$ of the parallel resonant circuit 504 is affected by temperature, as indicated in graph chart 600 of FIG. 6. In the chart 600, conductance $G_{LC}$ is shown along the vertical axis, and distance d between the metallic object 506 and the inductance 508 is along the horizontal axis. The distance increases along the horizontal axis, and at the origin the metallic object 506 is essentially in contact with the coil. Two conductance curves 602, 604 are shown, each corresponding to a different operating temperature of the circuit. At a nominal temperature (for conductance curve 602) as the metallic object 506 moves closer to the coil 508, starting from the right side of the graph at point 605 and moving towards the left, the conductance $G_{LC}$ increases, and when the metallic object reaches a distance corresponding to distance $d_1$ (point 606) the resonant circuit conductance $G_{LC}$ is equal to the oscillator conductance $G_{OSC}$ allowing the metallic object 506 to be detected as being distance $d_1$ from the inductance 508. The oscillator conductance $G_{OSC}$ stays constant over temperature without temperature compensation. At a different operating temperature the conductance curve of the resonant circuit 504 $G_{LC}$ is shifted to curve 604 due to the effect of temperature on the resonant circuit. In this particular case as the object moves closer to the coil, the conductance of the resonant circuit 504 $G_{LC}$ increases and is equal to the oscillator conductance at a different distance $d_2$ (point 608), causing detection of the metallic object via the resonant circuit 504 to be at a different distance than at the nominal temperature represented by curve 602. Thus, without temperature compensation, the distance at which the presence of the metallic object is detected depends on the present temperature of the resonant circuit. Clearly this would be undesirable for proximity detection applications.

Accordingly, in order to address the problem of temperature drift, and returning to FIG. 5, the circuit 500 includes an active resistance controller 516, and an active resistance composed of adjustable resistance 518 and set resistance 514, similar to that of FIGS. 2-3. Using external fixed resistances 514, 520, which correspond to second external resistance 110 and first external resistance 108, respectively, the active resistance controller can provide a thermally compensated resistance having a temperature coefficient substantially equal or proportional to that of the resonant circuit 504. The resistances 514, 518 determine the oscillator 502 conductance value $G_{OSC}$. Since adjustable resistance 518 is adjusted with temperature by active resistance controller 516, the conductance of the oscillator 502 is therefore changed over temperature. The temperature compensation is set in such a way that the oscillator 502 conductance $G_{OSC}$ follows the temperature dependency of the resonant circuit 504, $G_{LC}$, allowing consistent detection of the metallic object at the desired detection distance over temperature. Thus, at the temperature corresponding to curve 604 of FIG. 6, the oscillator conductance $G_{OSC}$ is shifted by temperature compensation of the active resistance controller 516 to a compensated level 610, and the metallic object is then detected at distance $d_1$ 606 instead of distance $d_2$ 608, even though the temperature is different.

Various embodiments of the circuit disclosed herein can be implemented in various topologies. FIGS. 7-10 show various topologies for implementing circuit embodiments for providing an active resistance that has both a magnitude and a temperature coefficient that is set or selected by two control resistors. Generally, the various circuit topologies all apply a first independent electrical source to a first control resistor, such as first external resistor 108 of FIG. 2. The control resistor is otherwise independent and not coupled to other circuit elements. The first independent electrical source produces a first electrical parameter as a result of being applied to the first control resistor that is either a voltage across the first control resistor or an electric current through the first control resistor. The first independent source can be coupled directly to the first control resistor, or it can be used as a reference to apply voltage/current to the first control resistor that is equal or proportional to a voltage or current produced by the first independent source.

The various topologies can be grouped generally into two categories. In a first category, consistent with FIGS. 7 and 10, a mirrored electrical parameter corresponding to the first electrical parameter is applied to the first adjustable resistor to generate a second electrical parameter. In a second category, consistent with FIGS. 8-9, a second independent source is applied to the first adjustable resistor to generate the second electrical parameter. When configured consistent with the first category, the first adjustable resistor is dynamically adjusted to maintain a correspondence of the second electrical parameter with a second independent electrical source. When configured consistent with the second category, the first adjustable resistor is dynamically adjusted to maintain a correspondence of the second electrical parameter with the first electrical parameter. A second adjustable resistor that is used to compose the active resistor is adjusted in correspondence with the adjustment of the first adjustable resistor. A second control resistor is coupled to the second adjustable resistor to comprise the active resistance presented to a temperature sensitive circuit to compensate the temperature sensitive circuit operation over temperature. One of the independent electrical sources is temperature dependent while the other is stable over temperature. Generally it makes no difference which independent electrical source is temperature dependent and which is temperature stable. The temperature dependent electrical source can be either proportional to absolute temperature (PTAT) or complementary to absolute temperature (CTAT). The ratio of the first and second control resistors control the resulting temperature coefficient of the active resistance while the value of the first and the second control resistance, when keeping constant ratio of the two resistances, affects the resulting magnitude of the active resistance. Both the control resistors can be external resistors meaning they are external to the packaging of the active resistance controller and the first and second independent electrical parameter sources.

Figure 7:
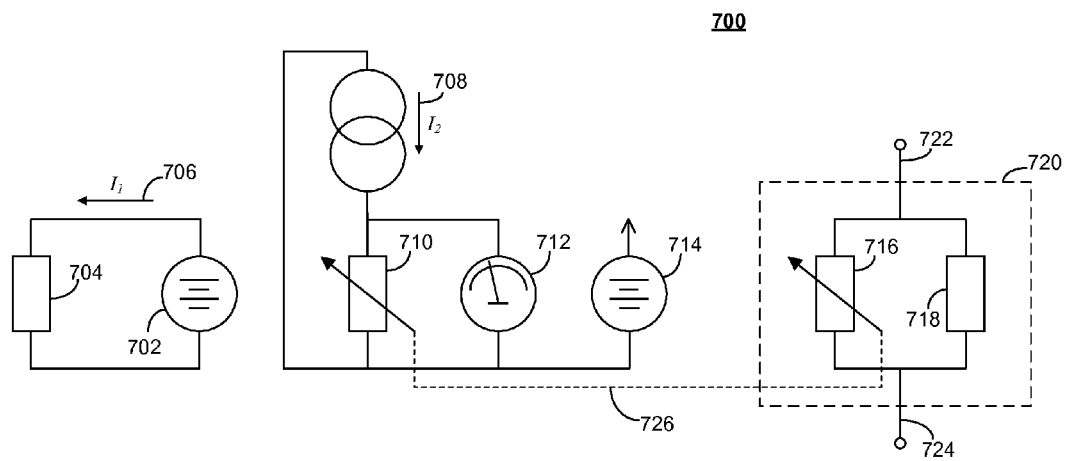
FIG. 7 shows a first operational schematic of a circuit, in accordance with an embodiment.

FIG. 7 shows a first operational schematic of a circuit 700, in accordance with an embodiment. The circuit is generally representative of the more detailed circuit implementation of FIG. 2, although those familiar with the art will realize that other implementations consistent with that of FIG. 7 can be realized. In the circuit 700 a voltage source 702 applies a voltage to a first control resistor 704. The first control resistor 704 is analogous to the first external resistor 108 of FIG. 2, and the voltage provided by the voltage source 702 is the first independent electrical source for the circuit 700. As a result of the voltage being applied to the first control resistor 704 a first electrical parameter results in the form of an electrical current 706, $I_1$. The first electrical parameter $I_1$ 706 is used to control a mirrored electrical parameter, current 708, $I_2$, which is analogous to mirror current $I_M$ of FIG. 2. The mirrored current $I_2$ 708 is applied to a first adjustable resistance 710. The resulting voltage across the first adjustable resistance is the second electrical parameter for the present circuit topology 700, and is sampled or measured by sensing means 712 and compared to the second independent electrical source, which in the present embodiment is voltage source 714. The first adjustable resistance 710 is then adjusted such that the second electrical parameter, which is the voltage across the first adjustable resistance 710 produced as a result of mirrored current 708, is maintained in correspondence with the voltage of second independent source 714. The voltage across first adjustable resistance can be maintained to be proportional to, if not the same as, the voltage provided by voltage source 714. Either voltage source 702 or voltage source 714 is temperature dependent, and the other voltage source is stable over temperature.

The active resistance 720 includes the second adjustable resistance 716 and a second control resistor 718, which can be an external resistor analogous to second external resistor 110 of FIG. 2. The active resistance 720 is presented to another circuit, such as a temperature sensitive circuit 118 of FIG. 1 via terminals 722, 724. The terminals 722, 724 are representative of any suitable electrical connection means. The second adjustable resistance 716 is adjusted in correspondence with adjustment of the first adjustable resistance 710 as indicated by line 726. Second adjustable resistance and second control resistor, forming active resistance, can be connected in parallel or in series.

The circuit topology 700 of FIG. 7 is an example of the type where the first electrical parameter is mirrored to the first adjustable resistor, and the second independent source is used as a reference to adjust the first adjustable resistor to maintain the second electrical parameter, the voltage across the first adjustable resistor produced by the mirrored current, in correspondence with the second independent source. If first independent source 702 is temperature dependent, i.e. it varies with temperature, then the mirror current 708 will likewise vary with temperature. Second independent source 714 is temperature stable, thus, as the mirrored current 708 varies, the first adjustable resistor 710 will have to be adjusted to maintain the voltage across it in correspondence with the voltage of source 714 which does not change with temperature. Conversely, if first independent source 702 is temperature stable, and second independent source 714 is temperature dependent, then mirror current 708 will be temperature stable, and first adjustable resistor 710 will be adjusted as the voltage of second independent source 714 varies to maintain the voltage across the first adjustable resistor 710 in correspondence with the voltage of second independent source 714. The circuit topologies of FIGS. 8 and 9 differ from that of FIG. 7 in that the second independent source is used by applying it to the first adjustable resistor, rather than using it as a reference as in FIG. 7.

Figure 8:
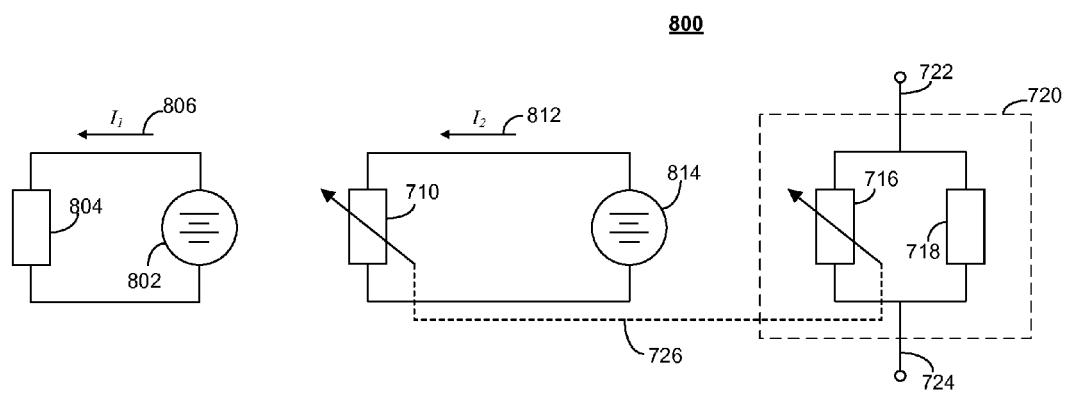
FIG. 8 shows a second operational schematic of a circuit, in accordance with an embodiment.

FIG. 8 shows a second operational schematic of a circuit topology 800, in accordance with an embodiment. A first independent source 802, which is a voltage source, applies voltage to the first control resistor 804. As a result a current 806, $I_1$, flows through the resistor 804 and operates as the first electrical parameter in the present circuit topology 800. A second independent source 814 provides a voltage to first adjustable resistance 710 to produce the second electrical parameter in the form of electric current 812. The first adjustable resistor 710 is than dynamically adjusted to maintain correspondence between current 806 and current 812. If independent source 802 is temperature dependent, then the voltage it provides will vary with temperature, and independent source 814 must then be a temperature stable source which does not change as temperature varies. Thus, as temperature varies, current 806 will vary and first adjustable resistor 710 must be adjusted so that current 812 changes with current 806. First adjustable resistor 710 can be adjusted such that current 812 remains equal to current 806, as a 1 to 1 correspondence, or some other proportional correspondence. Similarly, in embodiments where source 802 is temperature stable, then source 814 must be temperature dependent, and current 806 will not change over temperature. However, since the voltage of source 814 will then vary with temperature, first adjustable resistance 710 must be adjusted to maintain current 812 in correspondence with current 806.

Regardless of which source 802, 814 is temperature stable and which is temperature dependent, first adjustable resistor 710 must be adjusted as temperature varies to maintain correspondence between currents 806, 812. Second adjustable resistor 716 is adjusted in correspondence with the adjustment of first adjustable resistor 710. Active resistance 720 is therefore adjusted over temperature as a result of adjustment of second adjustable resistor 716.

Figure 9:
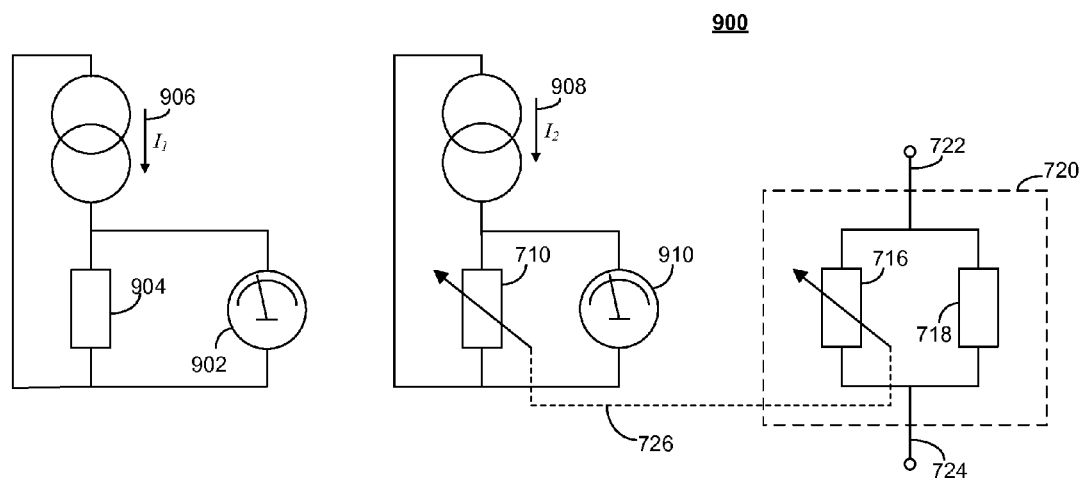
FIG. 9 shows a third operational schematic of a circuit, in accordance with an embodiment.

FIG. 9 shows a third operational schematic of a circuit topology 900, in accordance with an embodiment. The present topology 900 applies a first independent current source 906 to the first control resistor 904 to produce a voltage 902 across the first control resistor 904. The voltage 902 is used as the first electrical parameter in the present topology 900. A second independent current source 908 is applied to the first adjustable resistor 710, which produces a voltage 910 as the second electrical parameter in the present topology 900. One of the independent current sources 906, 908 is temperature dependent and the other is temperature stable. The first adjustable resistor 710 is then adjusted to maintain correspondence between voltage 902 and voltage 910. As a result of adjusting the first adjustable resistor 710, the second adjustable resistor 716 is adjusted in correspondence with the adjustment of first adjustable resistor 710.

Figure 10:
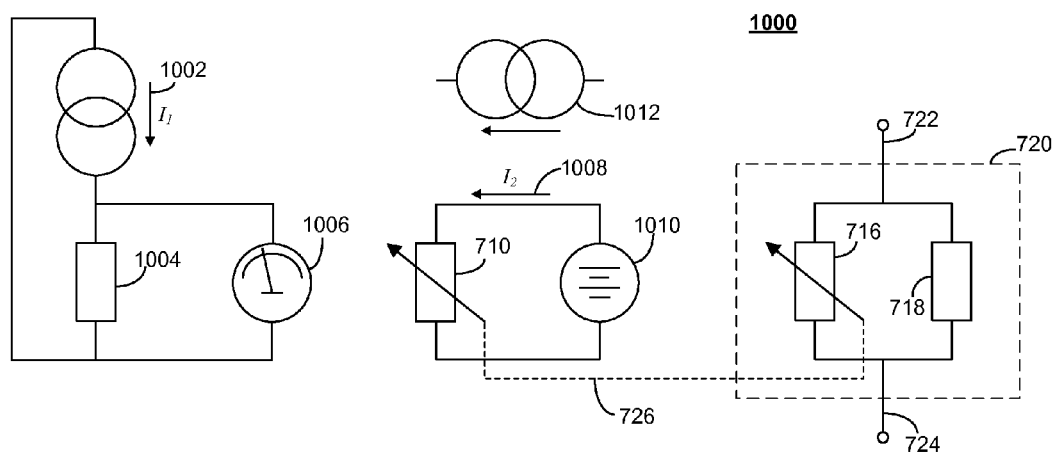
FIG. 10 shows a fourth operational schematic of a circuit, in accordance with an embodiment.

FIG. 10 shows a fourth operational schematic of a circuit topology 1000, in accordance with an embodiment. The present topology 1000 applies a first independent current source 1002 to the first control resistor 1004 to produce a voltage 1006 across the first control resistor 1004. In the present topology 1000 the current provided by the current source 1002 is the first independent electrical source for the circuit 1000. As a result of the current being applied to the first control resistor 1004 a first electrical parameter results in the form of a voltage 1006. The first electrical parameter 1006 is used to control a voltage source 1010, which is applied to the first adjustable resistor 710 and produces a current 1008 as the second electrical parameter in the present topology 1000. The first adjustable resistor 710 is then adjusted such that the second electrical parameter, which is the current $I_2$, 1008 through the first adjustable resistance 710 produced as a result of applied voltage source 1010, is maintained in correspondence with the current of second independent current source 1012. One of the independent current sources 1002, 1012 is temperature dependent and the other is temperature stable. As a result of adjusting the first adjustable resistor 710, the second adjustable resistor 716 is adjusted in correspondence with the adjustment of first adjustable resistor 710.

Accordingly, an embodiment of the invention comprises a semiconductor device that includes a mirroring block that has a first leg configured to provide a temperature dependent voltage to a first resistor interface. The first resistor interface is configured to couple to a first resistor, and the temperature dependent voltage produces a temperature dependent current through the first leg and the first resistor. The current mirror also includes a mirror leg that provides a mirror current that is proportional to the temperature dependent current to a first adjustable resistance. An active resistance controller is coupled to the first adjustable resistance and samples a voltage across the first adjustable resistance produced by the mirror current. The active resistance controller adjusts a resistance of the first adjustable resistance to maintain the sampled voltage at a fixed proportional value of a temperature stable voltage. The fixed proportional value can be a one to one correspondence such that the sampled voltage and the temperature stable voltage are equal. A second adjustable resistance is coupled across a second resistor interface and the active resistance controller, and has a resistance that is adjusted in correspondence to the adjustment of the first adjustable resistance.

In other embodiments the invention comprises a method of forming a semiconductor device. The semiconductor device is formed by forming a mirroring block having a first leg which provides a proportional to absolute temperature (PTAT) current responsive to a PTAT voltage applied to a first resistor interface. The first resistor interface is configured to accept a first resistor, and the PTAT current is proportional to a ratio of the PTAT voltage and a resistance of the first resistor. The semiconductor device is further formed by forming the current mirror to additionally have a mirror leg that provides a mirror current that is proportional to the PTAT current to a first adjustable resistance. The method further includes forming an active resistance control circuit operably coupled to the first adjustable resistance, and that samples a voltage across the first adjustable resistance produced by the mirror current and adjusts a resistance of the first adjustable resistance to maintain the sampled voltage at a value proportional to a fixed reference voltage. The fixed reference voltage remains constant over temperature. The method further includes forming a second adjustable resistance coupled across a second resistor interface and which is responsive to the active resistance control circuit. The second adjustable resistance has a resistance that is adjusted by the active resistance control circuit in proportion to the adjustment of the first adjustable resistance.

Still other embodiments include a semiconductor product that includes first and second external resistor interfaces configured to couple to first and second control resistors, respectively. The semiconductor product further includes first and second adjustable resistances. The second adjustable resistance is coupled to the second external resistor interface. An active resistance controller is configured to apply a first independent electrical source to the first control resistor to generate a first electrical parameter. The active resistance controller is further configured to apply to the first adjustable resistor either a mirrored electrical parameter corresponding to the first electrical parameter to generate a second electrical parameter, or a second independent electrical source to generate the second electrical parameter. When the active resistance controller is configured to apply the mirrored electrical parameter to the first adjustable resistor, the active resistance controller is further configured to dynamically adjust the first adjustable resistor to maintain a correspondence of the second electrical parameter with the second independent electrical source. When the active resistance controller is configured to apply the second independent electrical source to the first adjustable resistor, the active resistance controller is further configured to dynamically adjust the first adjustable resistor to maintain a correspondence of the second electrical parameter with the first electrical parameter. One of the first and second independent electrical sources is temperature dependent and the other independent source is temperature stable. The active resistance controller is further configured to adjust the second adjustable resistance in correspondence with adjustment of the first adjustable resistance.

One of ordinary skill in the art will realize that the first and second electrical parameters can be produced as either an electrical current or a voltage. Each of these can be used to force adjustment of the first adjustable resistance with either current through, or voltage across the first adjustable resistance, by using various known means of monitoring the various electrical parameters.

This invention can be embodied in other forms without departing from the spirit or essential attributes thereof. Accordingly, reference should be made to the following claims, rather than to the foregoing specification, as indicating the scope of the invention.

What is claimed is:

1. A semiconductor device, comprising:
   a mirroring block having a first leg configured to provide a temperature dependent voltage to a first resistor interface, the first resistor interface configured to couple to a first resistor, the temperature dependent voltage producing a temperature dependent current through the first leg and the first resistor;
   the mirroring block further having a mirror leg that provides a mirror current proportional to the temperature dependent current to a first adjustable resistance;
   an active resistance controller coupled to the first adjustable resistance that samples a voltage across the first adjustable resistance produced by the mirror current and adjusts a resistance of the first adjustable resistance to maintain the sampled voltage at a fixed proportional value of a temperature stable voltage; and
   a second adjustable resistance coupled across a second resistor interface and coupled to the active resistance controller and having a resistance that is adjusted in correspondence to the adjustment of the first adjustable resistance.

2. The semiconductor device of claim 1, wherein the active resistance controller outputs a digital control signal to the first and second adjustable resistances.

3. The semiconductor device of claim 2, wherein the first and second adjustable resistances are digitally adjustable.

4. The semiconductor device of claim 1, wherein the temperature dependent voltage is provided by a bandgap device.

5. The semiconductor device of claim 4, wherein the mirroring block comprises:
   an op amp having a first input and a second input, the first input coupled to the bandgap device such that the temperature dependent voltage is applied to the first input, the second input coupled to the first resistor interface at a high pin of the first resistor interface; and
   a regulator device in series in the first leg of the current mirror between the high pin of the first resistor interface and a mirrored transistor, and having an input coupled to an output of the op amp.

6. The semiconductor device of claim 1, wherein the mirror current and the temperature dependent current have a one to one proportion.

7. The semiconductor device of claim 1, wherein the semiconductor device is included in an integrated circuit package, the first and second resistor interfaces each include pins of the integrated circuit package.

8. The semiconductor device of claim 7, wherein the second resistor interface is configured to provide a temperature compensated resistance.

9. A method of forming a semiconductor device, comprising:
   forming a mirroring block having a first leg which provides a temperature dependent current responsive to a temperature dependent voltage applied to a first resistor interface, the first resistor interface operable to accept a first resistor, the temperature dependent current being proportional to a ratio of the temperature dependent voltage to a resistance of the first resistor;
   forming the mirroring block to further having a mirror leg that provides a mirror current proportional to the temperature dependent current to a first adjustable resistance;
   forming an active resistance controller coupled to the first adjustable resistance that samples a voltage across the first adjustable resistance produced by the mirror current and adjusts a resistance of the first adjustable resistance to maintain the sampled voltage at a fixed proportional value of a reference voltage; and
   forming a second adjustable resistance coupled across a second resistor interface and coupled to the active resistance controller and having a resistance that is adjusted in proportion to the adjustment of the first adjustable resistance.

10. The method of claim 9, further comprising forming the active resistance controller to output a digital control signal to the first and second adjustable resistances.

11. The method of claim 10, further comprising forming the first and second adjustable resistances to be digitally adjustable.

12. The method of claim 9, further comprising forming a bandgap device to provide the temperature dependent voltage.

13. The method of claim 12, further comprising:
   forming an op amp having a first input and a second input, the first input coupled to the bandgap device such that the temperature dependent voltage is applied to the first input, the second input coupled to the first resistor interface at a high pin of the first resistor interface; and
   forming a regulator device in series in the first leg of the current mirror between the high pin of the first resistor interface and a mirrored transistor, and having an input coupled to an output of the op amp.

14. The method of claim 9, wherein forming the mirror current comprises forming the current mirror such that the mirror current and the temperature dependent current have a one to one proportion.

15. The method of claim 9, wherein the semiconductor device is included in an integrated circuit package, the method further comprises forming the first and second resistor interfaces to each include pins of the integrated circuit package.

16. The method of claim 15, wherein the second resistor interface is configured to provide a temperature compensated active resistance.

17. A semiconductor product, comprising:
   first and second external resistor interfaces configured to couple to first and second control resistors, respectively;
   first and second adjustable resistances, the second adjustable resistance is coupled to the second external resistor interface;
   an active resistance controller configured to apply a first independent electrical source to the first control resistor to generate a first electrical parameter, the active resistance controller is further configured to apply to the first adjustable resistor either:
     a mirrored electrical parameter corresponding to the first electrical parameter to generate a second electrical parameter; or
     a second independent electrical source to generate the second electrical parameter;
   when the active resistance controller is configured to apply the mirrored electrical parameter to the first adjustable resistor, the active resistance controller is further configured to dynamically adjust the first adjustable resistor to maintain a correspondence of the second electrical parameter with the second independent electrical source;
   when the active resistance controller is configured to apply the second independent electrical source to the first adjustable resistor, the active resistance controller is further configured to dynamically adjust the first adjustable resistor to maintain a correspondence of the second electrical parameter with the first electrical parameter;
one of the first and second independent electrical sources is temperature dependent and the other is temperature stable; and
the active resistance controller is further configured to adjust the second adjustable resistance in correspondence with adjustment of the first adjustable resistance.

18. The active resistance controller of claim 17, wherein the second external resistor interface is operable to provide a temperature active resistance, the temperature active resistance having a nominal resistance and temperature coefficient dependent on the first and second control resistors and a ratio of the first and second control resistor resistances.

19. The semiconductor product of claim 18, wherein the second adjustable resistance is configured to be coupled in series with the second control resistor.

20. The semiconductor product of claim 18, wherein the active resistance controller further comprises an op-amp configured to provide an output that adjusts the first and second adjustable resistances.

* * * * *